(12) United States Patent
Kuroda et al.

(10) Patent No.: US 11,700,686 B2
(45) Date of Patent: Jul. 11, 2023

(54) METHOD FOR MANUFACTURING WIRING BOARD

(71) Applicant: TOYOTA JIDOSHA KABUSHIKI KAISHA, Toyota (JP)

(72) Inventors: Keiji Kuroda, Toyota (JP); Haruki Kondoh, Okazaki (JP); Kazuaki Okamoto, Toyota (JP); Rentaro Mori, Kasugai (JP); Hiroshi Yanagimoto, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/366,417

(22) Filed: Jul. 2, 2021

(65) Prior Publication Data

US 2022/0007506 A1    Jan. 6, 2022

(30) Foreign Application Priority Data

Jul. 6, 2020   (JP) .................................. 2020-116544

(51) Int. Cl.
*H05K 3/38* (2006.01)
*H05K 3/02* (2006.01)
(Continued)

(52) U.S. Cl.
CPC ........... *H05K 1/0298* (2013.01); *H05K 1/097* (2013.01); *H05K 3/027* (2013.01); *H05K 3/388* (2013.01); *H05K 2201/0338* (2013.01)

(58) Field of Classification Search
CPC ............................... H05K 3/027; H05K 3/388
See application file for complete search history.

(56) References Cited

U.S. PATENT DOCUMENTS 5,127,998 A   7/1992   Cole, Jr. et al.
5,230,965 A   7/1993   Cole, Jr. et al.
(Continued)

FOREIGN PATENT DOCUMENTS

EP   3037571 A1    6/2016
JP   3-207886 A    9/1991
(Continued)

OTHER PUBLICATIONS

Office Action issued by the U.S. Patent Office dated Oct. 5, 2022 in U.S. Appl. No. 17/400,715.
(Continued)

*Primary Examiner* — Peter Dungba Vo
*Assistant Examiner* — Jose K Abraham
(74) *Attorney, Agent, or Firm* — Sughrue Mion, PLLC

(57) ABSTRACT

A method for manufacturing a wiring board capable of improving adhesion between an underlayer and a seed layer. An electrically conductive underlayer is disposed on the surface of an insulating substrate and a seed layer containing metal is disposed on the surface of the underlayer to prepare a substrate with seed-layer. A diffusion layer in which elements forming the underlayer and seed layer are mutually diffused is formed between the underlayer and the seed layer, by irradiating the seed layer with a laser beam. A metal layer is formed on the surface of the seed layer by disposing a solid electrolyte membrane between an anode and the seed layer as a cathode and applying voltage between the anode and the underlayer. An exposed portion without the seed layer of the underlayer is removed from the insulating substrate.

2 Claims, 4 Drawing Sheets

(51) Int. Cl.
H05K 1/02 (2006.01)
H05K 1/09 (2006.01)

(56) References Cited

U.S. PATENT DOCUMENTS

| | | | |
|---|---|---|---|
| 10,854,352 B1 | 12/2020 | Ram et al. | |
| 2005/0103761 A1* | 5/2005 | Miki | H01R 13/03 |
| | | | 219/121.69 |
| 2008/0311414 A1 | 12/2008 | Tanaka et al. | |
| 2010/0263921 A1* | 10/2010 | Nakahara | H05K 3/108 |
| | | | 205/112 |
| 2013/0065351 A1 | 3/2013 | Baker-O'Neal et al. | |
| 2013/0220535 A1* | 8/2013 | Lee | H05K 3/0026 |
| | | | 156/60 |
| 2014/0023881 A1* | 1/2014 | Sakaguchi | B32B 7/12 |
| | | | 427/535 |
| 2015/0014178 A1 | 1/2015 | Hiraoka et al. | |
| 2016/0076162 A1 | 3/2016 | Sato et al. | |
| 2016/0186354 A1 | 6/2016 | Hiraoka et al. | |
| 2016/0289840 A1* | 10/2016 | Sato | C25D 5/02 |
| 2017/0347449 A1* | 11/2017 | Sugiura | H05K 3/24 |
| 2018/0014403 A1 | 1/2018 | Kasuga et al. | |
| 2019/0029122 A1* | 1/2019 | Len | C23C 18/42 |
| 2019/0256996 A1 | 8/2019 | Glatthaar et al. | |
| 2020/0245458 A1* | 7/2020 | Miyata | C09D 11/52 |
| 2021/0084774 A1 | 3/2021 | Okamoto et al. | |

FOREIGN PATENT DOCUMENTS

| | | | |
|---|---|---|---|
| JP | 2002-299833 A | | 10/2002 |
| JP | 2008-308367 A | | 12/2008 |
| JP | 2014-185371 A | | 10/2014 |
| JP | 2016-125087 A | | 7/2016 |
| JP | 2021-048210 A | | 3/2021 |
| KR | 10-1046255 B1 | | 7/2011 |
| KR | 10-2016-0079709 A | | 7/2016 |
| KR | 20170133158 A | * | 12/2017 |
| WO | 2013/125643 A1 | | 8/2013 |

OTHER PUBLICATIONS

Office Action issued by the US Patent Office dated Mar. 10, 2023 in U.S. Appl. No. 17/400,715.

* cited by examiner

FIG. 5

| | Reference Example 1 | Reference Comparative Example 1 |
|---|---|---|
| Tape peeling test | Excellent | Defective |
| TEM image | 2 million times<br><br>Seed layer (Ag)<br>Diffusion layer containing W, Ag, Si, and O<br>Underlayer (WSi$_2$) | 1 million times<br><br>Ag — Seed layer (Ag)<br>Si-O — Si-O<br>WSi$_2$ — Underlayer (WSi$_2$)<br>Ag and W are not diffused |

METHOD FOR MANUFACTURING WIRING BOARD

CROSS REFERENCE TO RELATED APPLICATIONS

The present application claims priority from Japanese patent application JP 2020-116544 filed on Jul. 6, 2020, the entire content of which is hereby incorporated by reference into this application.

BACKGROUND

Technical Field

The present disclosure relates to a method for manufacturing a wiring board in which a wiring layer is formed on the surface of a substrate, and a wiring board.
Background Art In the conventional methods for manufacturing a wiring board, a metal layer serving as a wiring pattern is formed on the surface of a substrate. Such methods for manufacturing a wiring pattern use a method of film deposition of metallic coating as disclosed in JP 2016-125087 A, for example. The method of film deposition firstly forms a seed layer corresponding to a wiring pattern on the surface of a substrate. Next, the method brings the seed layer into contact with a solid electrolyte membrane impregnated with metal ions, and then applies a power source voltage between an anode and the seed layer as a cathode, thereby to deposit the metal impregnated into the solid electrolyte membrane on the seed layer. Accordingly, the method can obtain a wiring pattern of a metal layer deposited on the seed layer.

SUMMARY

In the film deposition method disclosed in JP 2016-125087 A, however, a power source is coupled to a portion of the seed layer so that the seed layer functions as a cathode, and therefore, as the wiring pattern becomes minute, it becomes difficult to couple the power source to all of the wiring portions forming the seed layer.

Thus, a substrate with seed-layer may be prepared, which includes an electrically conductive underlayer disposed on the surface of an insulating substrate and a seed layer containing metal disposed on the surface of the underlayer. However, when the adhesion between the underlayer and the seed layer is low, in depositing the metal impregnated in the solid electrolyte membrane on the seed layer and then peeling off the solid electrolyte membrane from the seed layer, the underlayer and the seed layer could be peeled off from each other. In some use environment, the underlayer and the seed layer that form the wiring layer could be peeled off from each other.

The present disclosure has been made in view of the foregoing, and provides a method for manufacturing a wiring board having an improved adhesion between an underlayer and a seed layer, and such a wiring board.

In view of the foregoing, the present disclosure provides a method for manufacturing a wiring board including an insulating substrate, and a wiring layer disposed on the surface of the insulating substrate and having a predetermined wiring pattern, the method comprising: preparing a substrate with seed-layer including an electrically conductive underlayer on the surface of the insulating substrate and a seed layer on the surface of the underlayer, the seed layer having a predetermined pattern corresponding to the wiring pattern and containing metal; forming a diffusion layer in which an element forming the underlayer and an element forming the seed layer are mutually diffused, between the underlayer and the seed layer, by irradiating the seed layer with a laser beam; forming a metal layer on the surface of the seed layer by disposing a solid electrolyte membrane between an anode and the seed layer as a cathode, pressing the solid electrolyte membrane against at least the seed layer, and applying voltage between the anode and the underlayer to reduce metal ions contained in the solid electrolyte membrane; and forming the wiring layer by removing, from the insulating substrate, an exposed portion without the seed layer of the underlayer.

The method for manufacturing a wiring board according to the present disclosure forms a metal layer on a substrate with seed-layer including an underlayer on the surface of an insulating substrate, and a seed layer on the surface of the underlayer. To this end, the metal layer is formed on the surface of the seed layer by pressing a solid electrolyte membrane against the seed layer and applying voltage between an anode and the underlayer to reduce metal ions contained in the solid electrolyte membrane. Herein, for example, when the surface of the underlayer contains an oxide, even if the solid electrolyte membrane is pressed against the underlayer as well as the seed layer, the metal layer can be selectively formed only on the surface of the seed layer. Therefore, the metal layer can be formed on the surface of the seed layer without using a resin resist pattern. A portion of the underlayer where the seed layer or the metal layer is not formed, that is, an exposed portion without the seed layer is then removed, so that a wiring layer having a predetermined wiring pattern can be formed on the surface of the insulating substrate. As stated above, the method can form the metal layer on the surface of the seed layer without using a resin resist pattern. This eliminates the need for forming and removing a resist pattern. As a result, the method does not require multiple steps in manufacturing the wiring board and can suppress generation of a large amount of liquid waste.

Further, in the present disclosure, in a diffusion layer formation step, the seed layer is irradiated with a laser beam to form, between the underlayer and the seed layer, a diffusion layer in which an element forming the underlayer and an element forming the seed layer are mutually diffused. Thus, the adhesion between the underlayer and the seed layer can be improved via such a diffusion layer.

In some embodiments, the element forming the seed layer is a noble metal element. The underlayer of the prepared substrate with seed-layer contains an oxide on its surface contacting the seed layer. In the diffusion layer formation step, a diffusion layer in which oxygen originating from the oxide is diffused is formed as the diffusion layer by irradiating the seed layer with the laser beam.

Since noble metal elements typically have a low affinity with an oxide, the adhesion between the seed layer and the underlayer cannot be expected. In this embodiment, the seed layer is irradiated with a laser beam so that the diffusion layer in which the oxygen element of the oxide contained on the surface of the underlayer contacting the seed layer and the noble metal element of the seed layer are diffused can be obtained. Thus, the adhesion between the underlayer and the seed layer can be improved via such a diffusion layer.

In some embodiments, the seed layer contains metallic nanoparticles. According to such an embodiment, gaps are formed between the metallic nanoparticles contained in the seed layer. The gaps allow the laser beam to penetrate through the seed layer and to reach the interface between the underlayer and the seed layer. As a result, the laser beam energy can be fed to the interface between the underlayer and the seed layer, so that the diffusion layer in which the elements of the underlayer and the seed layer are more uniformly diffused can be stably formed between the underlayer and the seed layer.

In some embodiments, in a preparation step of the substrate with seed-layer, ink in which the metallic nanoparticles are dispersed in a dispersion medium is applied onto the underlayer in the predetermined pattern, and the applied ink is then dried so as to form the seed layer. The ink is dried until the amount of the dispersion medium remaining in the seed layer is reduced to 0.1 mass % or less relative to the seed layer.

According to such an embodiment, the applied ink is dried until the amount of the dispersion medium contained in the seed layer is reduced to 0.1 mass % or less, so that the diffusion layer can be stably formed when the laser beam is irradiated, which can improve the adhesion between the underlayer and the seed layer. Herein, if the remaining amount of the dispersion medium of the ink exceeds 0.1 mass %, the laser beam irradiation causes the dispersion medium to evaporate to thereby rapidly expand in volume, scattering the metallic nanoparticles. This makes it difficult to stably form the diffusion layer.

In the specification of the present disclosure, a wiring board having a wiring layer formed on the surface of a substrate is also disclosed. The wiring board according to the present disclosure includes an insulating substrate, and a wiring layer disposed on the surface of the insulating substrate and having a predetermined wiring pattern, in which the wiring layer includes an electrically conductive underlayer disposed on the surface of the insulating substrate, a seed layer disposed on the surface of the underlayer and containing metal, and a metal layer disposed on the surface of the seed layer, and a diffusion layer, in which an element forming the underlayer and an element forming the seed layer are mutually diffused, is formed between the underlayer and the seed layer.

According to the wiring board of the present disclosure, the diffusion layer in which the elements forming the underlayer and the seed layer are mutually diffused is formed between the underlayer and the seed layer, so that the adhesion between the underlayer and the seed layer can be improved. As a result, the reliability of the wiring board can be improved.

According to a method for manufacturing a wiring board and the wiring board of the present disclosure, the adhesion between the underlayer and the seed layer can be improved.

BRIEF DESCRIPTION OF THE DRAWINGS

FIG. 5 shows the results of a tape peeling test conducted on test pieces of Reference Example 1 and Reference Comparative Example 1 and their TEM (transmission electron microscope) images.

DETAILED DESCRIPTION

A wiring board and a method for manufacturing the wiring board according to an embodiment of the present disclosure will be described below.

1. Method for Manufacturing Wiring Board 1

Figure 1:
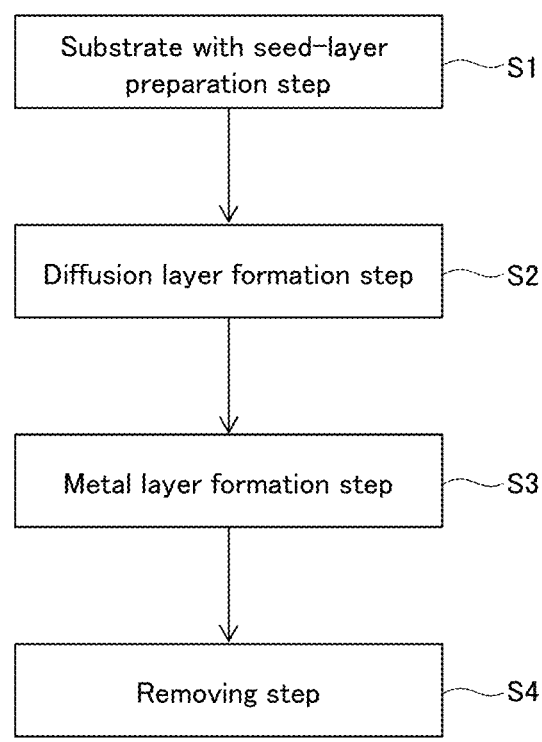
FIG. 1 is a flowchart of a method for manufacturing a wiring board according to an embodiment of the present disclosure.

Firstly, a method for manufacturing a wiring board 1 according to the present embodiment will be described. FIG. 1 is a flowchart of the method for manufacturing the wiring board 1 according to the embodiment of the present disclosure. FIG. 2A to FIG. 2D are schematic conceptual views for explaining, respectively, a preparation step S1 of a substrate with seed-layer 10, a formation step S2 of a diffusion layer 14, a formation step S3 of a metal layer 15, and a removing step S4 that are shown in FIG. 1.

Figure 2A:
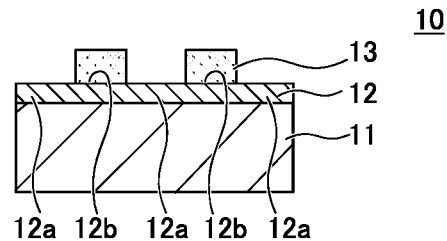
FIG. 2A is a schematic conceptual view for explaining a step of preparing a substrate with seed-layer of FIG. 1.
Figure 2B:
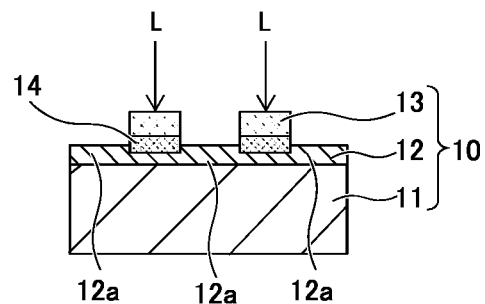
FIG. 2B is a schematic conceptual view for explaining a step of forming a diffusion layer of FIG. 1.
Figure 2C:
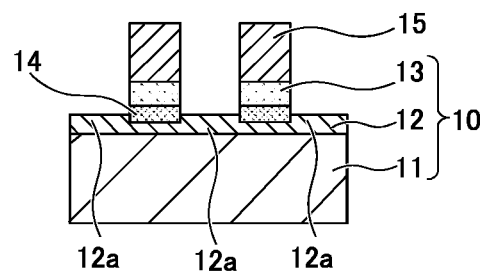
FIG. 2C is a schematic conceptual view for explaining a step of forming a metal layer of FIG. 1.
Figure 2D:
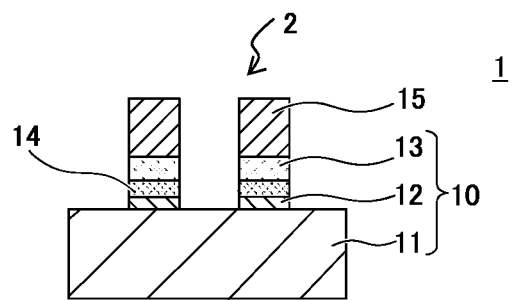
FIG. 2D is a schematic conceptual view for explaining a removing step of FIG. 1.

The method for manufacturing the wiring board 1 according to the present embodiment can be applied to the manufacturing of the wiring board 1 including an insulating substrate 11, and a wiring layer 2 disposed on the surface of the insulating substrate 11 and having a predetermined wiring pattern (see FIG. 2D). In particular, the manufacturing method is suitable for manufacturing of a wiring board having a high-density wiring pattern.

1-1. Preparation Step S1 of Substrate with Seed-Layer 10

The manufacturing method of the present embodiment firstly performs the preparation step S1 of the substrate with seed-layer 10 as shown in FIG. 1. In this step, as shown in FIG. 2A, an underlayer 12 is disposed on the surface of the substrate 11 and a seed layer 13 is disposed on the surface of the underlayer 12 to prepare the substrate with seed-layer 10.

(1) Substrate 11

The substrate 11 is not particularly limited as long as it has an insulating property, and in some embodiments, a substrate made of a glass epoxy resin, a substrate made of a baked glass epoxy resin, a flexible film-like substrate made of a polyimide resin, for example, or a substrate made of glass is used. In the present embodiment, particularly, a substrate made of a glass epoxy resin may be used for the substrate 11.

When the substrate 11 is made of resin, examples of the resin include thermoplastic resin, such as ABS resin, AS resin, AAS resin, PS resin, EVA resin, PMMA resin, PBT resin, PET resin, PPS resin, PA resin, POM resin, PC resin, PP resin, PE resin, PI resin (polyimide), polymer alloy resin containing elastomer and PP, modified PPO resin, PTFE resin, ETFE resin, or the like, thermosetting resin, such as phenol resin, melamine resin, amino resin, unsaturated polyester resin, polyurethane, diallylphthalate, silicone resin, alkyd resin, or the like, resin obtained by adding cyanate resin to epoxy resin, for example, and liquid crystal polymer.

(2) Underlayer 12

The underlayer 12 is electrically conductive and supplies current to the seed layer 13. Considering that the metal layer 15 is formed selectively on the seed layer 13 as will be described later, the underlayer 12 may contain an oxide at least on the surface of an exposed portion (hereinafter referred to as an "exposed portion of the underlayer 12") 12a without the seed layer 13 of the underlayer 12. In the present embodiment, since the irradiation of a laser beam L allows the element forming the oxide to be diffused, as will be described later, the underlayer 12 may contain an oxide on a contacting surface (hereinafter referred to as a "contacting surface of the underlayer 12") 12b where the underlayer 12 contacts the seed layer 13. It should be noted that a portion not containing the oxide of the underlayer 12 is composed of material (base metal) that mainly forms the underlayer 12.

The oxide may be a natural oxide film formed naturally due to natural oxidation in the atmosphere or may be an oxide film (oxide layer) formed by surface treatment.

Examples of the natural oxide film may include a silicon oxide film when the underlayer 12 is silicide such as $ZrSi_2$ and $WSi_2$, which will be described later, and a passive film made of metal of Al, Cr, and Ti and their alloy when the underlayer 12 is made of such metals.

Meanwhile, examples of the oxide film formed by surface treatment may include an oxide film having a higher insulating property than that of the underlayer 12, specifically, an oxide film formed by performing oxidation treatment on the surface of the underlayer 12 or an oxide film separately disposed on the surface of the underlayer 12 by vapor deposition. Examples of the oxidation treatment may include $O_2$ plasma treatment, laser beam irradiation under an oxygen atmosphere, or furnace heating under an oxygen atmosphere. Examples of the vapor deposition may include plasma CVD, thermal CVD, or PVD using sputtering.

In the present embodiment, since the irradiation of the laser beam L allows the element forming the oxide contained on the contacting surface 12b of the underlayer 12 to be diffused, as will be described later, the surface treatment to form the oxide film may be performed prior to forming the seed layer 13. It should be noted that the surface treatment to form an oxide film may be performed on the exposed portion 12a of the underlayer 12 after forming the seed layer 13. In this case, a metal mask may be provided on the seed layer 13, as necessary.

Examples of the material of the underlayer 12 may include specifically metal silicide such as $ZrSi_2$, $WSi_2$, $CrSi_2$, or $MoSi_2$, metal such as Ti, Zr, Cr, Ni, or Si, or one or more of these metals.

The layer thickness of the underlayer 12 is not particularly limited, and may be 1 to 200 nm in some embodiments. When the layer thickness of the underlayer 12 is less than 1 nm, it is difficult to form the underlayer 12, while when the layer thickness of the underlayer 12 exceeds 200 nm, the material and process costs could rise.

The underlayer 12 is formed on the entire surface on one side of the substrate 11. The method for forming the underlayer 12 is not particularly limited, and the examples of the method may include PVD (physical vapor deposition) using sputtering, CVD (chemical vapor deposition), plating, spin coating, or printing.

(3) Seed Layer 13

The seed layer 13 is a metal-containing layer and functions as a cathode in forming the metal layer 15 having a wiring pattern. The seed layer 13 includes a plurality of independent patterns corresponding to the wiring pattern. These independent patterns are spaced apart from each other and are not electrically connected with each other.

The independent patterns forming the seed layer 13 are thus electrically connected with each other via the underlayer 12. Therefore, the metal layer 15 can be formed on the seed layer 13 without forming a lead for voltage application on the seed layer 13 in forming the metal layer 15 that will be described later. This eliminates the need for a space for a lead, thereby facilitating the formation of the wiring pattern with a higher density.

In the present embodiment, the layer thickness of the seed layer 13 is not particularly limited. Considering preventing the unevenness generated in forming the metal layer 15, the layer thickness of the seed layer 13 may be 20 nm or more, and considering the production cost, the layer thickness of the seed layer 13 may be 300 nm or less.

The elements forming the seed layer 13 may be noble metal elements that are highly resistant to oxidation. Examples of such noble metal elements to be used may include one or more types of metals selected from the group consisting of Pt, Pd, Rh, Cu, Ag, and Au.

The seed layer 13 may be formed on the surface of the underlayer 12 by, for example, vapor deposition or sputtering. In one example, the seed layer 13 may be formed such that ink (hereinafter referred to as "ink") in which metallic nanoparticles are dispersed in a dispersion medium is applied onto (printed on) the underlayer 12 in a predetermined pattern and the applied ink is then dried.

Herein, the seed layer formed by sputtering is a film continuously and densely formed. Thus, considering the penetration of the laser beam L that will be described later, the seed layer 13 may be formed using ink. The seed layer 13 formed as such contains metallic nanoparticles, between which gaps are formed. Such gaps facilitate the reaching of the laser beam L to the interface between the underlayer 12 and the seed layer 13 in the formation step S2 of the diffusion layer 14 that will be described later. This consequently enables the laser beam energy to be fed to the interface between the underlayer 12 and the seed layer 13, thereby being able to stably form, between the underlayer 12 and the seed layer 13, the diffusion layer 14 in which the elements of these layers are uniformly diffused.

In the present specification, "nanoparticle" refers to a particle having an average particle diameter of several to one hundred nano orders. Examples of the method for measuring the nanoparticle diameter may include a method in which particles within a given range in an FE-SEM image or a TEM image of metallic nanoparticles are extracted from the image to obtain the average value of the diameter (approximated diameter as a circle) of those metallic nanoparticles, so that the obtained value is determined to be the average particle diameter.

The average particle diameter of the metallic nanoparticles is not particularly limited, and may be smaller in some embodiments to form the wiring in the μm order. In one example, the average particle diameter may be 1 nm or more and 50 nm or less in the nm order. In one example, use of metallic nanoparticles having an average particle diameter of 20 nm or less may lower the melting point of the metallic particles, thereby facilitating the sintering. Examples of the metallic nanoparticles may include noble metal elements similar to those forming the seed layer 13 cited as examples.

When the seed layer 13 is formed using ink, the ink is applied onto the surface of the underlayer 12 so as to form a predetermined pattern and the applied ink is sintered. The method for applying ink is not particularly limited, and various printing methods, such as screen printing, inkjet printing, and transfer printing, may be used. When the seed layer 13 is formed by sintering, the sintering is performed at a temperature equal to or lower than the heat-resistant temperature of the substrate 11 (for example, about 250° C. or lower when the substrate 11 made of a glass epoxy resin is used).

The ink contains metallic nanoparticles and a dispersion medium in which the metallic nanoparticles are dispersed, and may further contain an additive, as necessary. The dispersion medium is not particularly limited and has a property of volatilizing during solidification in some embodiments. In one example, decanol can be used as the dispersion medium, and a linear fatty acid salt having around 10 to 17 carbon atoms can be used as the additive.

When the ink is used to form the seed layer 13, the seed layer 13 may be formed such that the ink in which the metallic nanoparticles are dispersed in the dispersion medium is applied onto the underlayer 12 in a predetermined pattern and the applied ink is then dried. In such forming, the ink is dried until the amount of the dispersion medium remaining in the seed layer 13 (hereinafter referred to as a "remaining amount") is reduced to 0.1 mass % or less relative to the seed layer 13.

Such configuration can improve the adhesion between the underlayer 12 and the seed layer 13. Herein, when the remaining amount of the dispersion medium exceeds 0.1 mass %, the irradiation of the laser beam L causes the dispersion medium to evaporate to thereby rapidly expand in volume, so that the metallic nanoparticles could scatter. This makes it difficult to form the diffusion layer 14 in which the metal forming the seed layer 13 is diffused, resulting in a lower adhesion between the underlayer 12 and the seed layer 13.

It should be noted that the remaining amount of the dispersion medium is the proportion (%) of the mass of the dispersion medium remaining in the seed layer 13 relative to the seed layer 13 (the total mass of the metallic nanoparticles forming the seed layer 13 and the dispersion medium remaining in the seed layer 13). Herein, the amount of the metallic nanoparticles forming the seed layer 13 and the amount of the dispersion medium remaining in the seed layer 13 can be measured by the GC-MS (gas chromatography) or the like.

1-2. Formation Step S2 of Diffusion Layer 14

Next, the formation step S2 of the diffusion layer 14 is performed, as shown in FIG. 1. In this step, the seed layer 13 is irradiated with the laser beam L so as to form, between the underlayer 12 and the seed layer 13, the diffusion layer 14 in which the elements forming the underlayer 12 and the seed layer 13 are mutually diffused, as shown in FIG. 2B. Such forming can improve the adhesion between the underlayer 12 and the seed layer 13 via the diffusion layer 14, as will be described later.

Further, the diffusion layer 14 can be formed with instant heat generated by the irradiation of the laser beam L. Thus, even when a substrate such as those made of a glass epoxy resin or a resin having a low heat-resistant temperature is used for the substrate 11, the diffusion layer 14 can be formed without damaging the substrate 11.

In addition, since typically, the underlayer 12 made of metal does not easily adhere to an oxide, when the contacting surface 12b of the underlayer 12 contains an oxide, the oxide on the contacting surface 12b is likely to lower the adhesion between the underlayer 12 and the seed layer 13. In the present embodiment, the irradiation of the laser beam L can form the diffusion layer 14 in which the oxygen originating from the oxide contained in the contacting surface 12b as well as the elements forming the underlayer 12 and the seed layer 13 is further diffused, as will be described later. As a result, the adhesion between the underlayer 12 and the seed layer 13 can be improved.

Noble metals typically have a low affinity with the oxygen of an oxide. Therefore, when the contacting surface 12b of the underlayer 12 contains an oxide and the seed layer 13 is formed with a noble metal element, heat treatment of the seed layer 13 as described later still cannot easily bond the noble metal element of the seed layer 13 to the oxide. Meanwhile, in the present embodiment, the irradiation of the laser beam L instantly increases the temperature at the interface between the underlayer 12 and the seed layer 13, as will be described later, which facilitates the diffusion of the noble metal element forming the seed layer 13 also into the oxide, thereby enabling the formation of the diffusion layer 14 in which the oxygen element originating from the oxide as one of the elements forming the underlayer and the noble metal element are diffused.

In the present embodiment, the output density and the irradiation time of the laser beam L are not particularly limited as long as the diffusion layer 14 is formed. For example, according to the results of the experiments conducted by the inventor, which will be described later, the output of the laser beam may be in the range of 45 to 70 W/mm$^2$ and the irradiation time may be around 1 to 120 seconds for stably forming the diffusion layer 14. These are some of the conditions under which the diffusion layer 14 is formed. Even when the output range and the irradiation time of the laser beam L are not within these conditions, since use of the laser beam L can form the diffusion layer 14 that is more stable as compared to the one obtained through heat treatment with normal heating, these conditions are not particularly limited, as long as the diffusion layer 14 is formed. Further, the output density and the irradiation time of the laser beam L may be set to the extent that the metal forming the seed layer 13 does not partially melt or agglomerate on the surface of the seed layer 13.

The laser beam L is not particularly limited as long as the diffusion layer 14 can be formed, and is a laser beam generated by lasers such as a solid laser, e.g., a YAG laser, a gas laser using $CO_2$ or the like, and semiconductor laser. The method for generation and irradiation of the laser beam is not particularly limited. The laser beam L is within the wavelength region of the infrared ray in some cases, and may be within the wavelength region (780 to 2,500 nm) of the near infrared ray. The irradiation of the laser beam L within the wavelength region of the near infrared ray increases the temperatures of the underlayer 12 and the seed layer 13 in a short period of time, thereby enabling the diffusion layer 14 with a high mutual diffusion to be formed.

1-3. Formation Step S3 of Metal Layer 15

Figure 3:
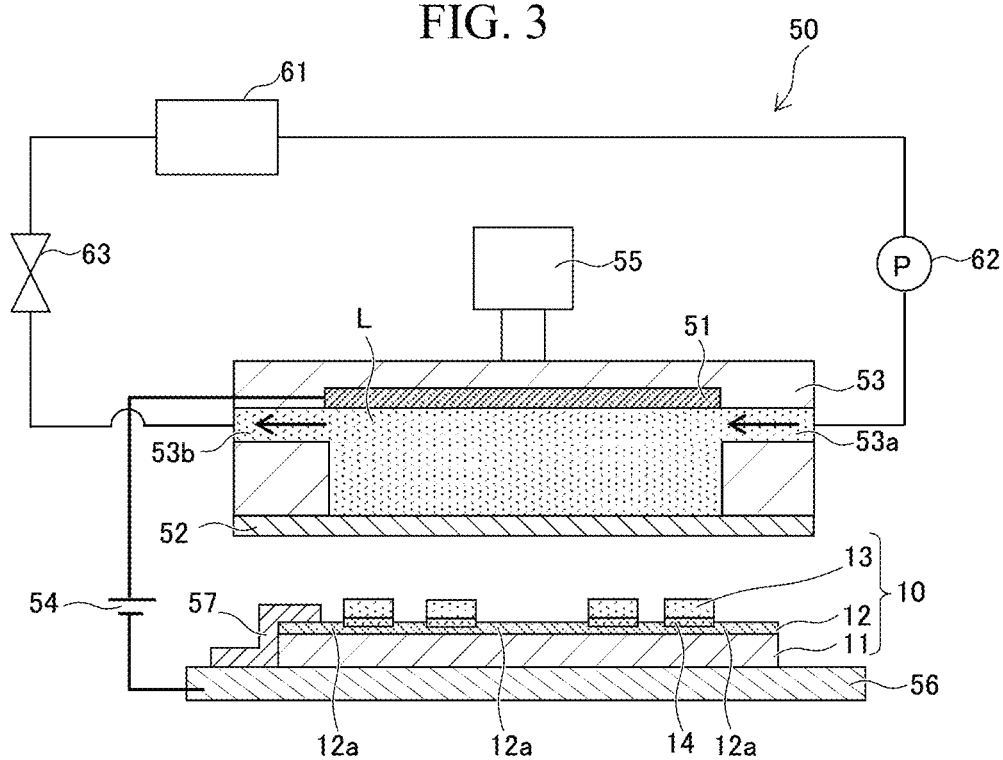
FIG. 3 is a cross-sectional view showing the structure of a film-deposition apparatus that is used to manufacture a wiring board according to the embodiment of the present disclosure.
Figure 4:
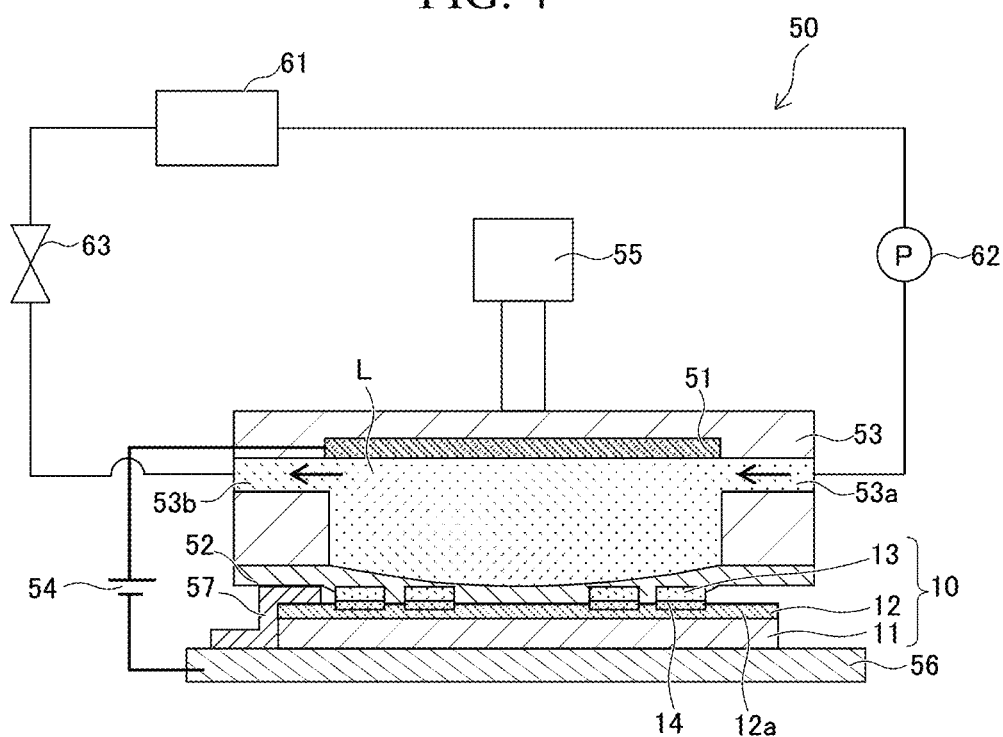
FIG. 4 is a cross-sectional view of the film-deposition apparatus shown in FIG. 3, showing the state of a substrate brought into contact with a solid electrolyte membrane.

Next, as shown in FIG. 1, the formation step S3 of the metal layer 15 is performed. In this step, a film-deposition apparatus 50 shown in FIG. 3 and FIG. 4 is used to form the metal layer 15 on the surface of the seed layer 13 of the substrate with seed-layer 10 as shown in FIG. 2C. Herein, the substrate with seed-layer 10 has the diffusion layer 14 between the underlayer 12 and the seed layer 13 that is formed through the irradiation of the laser beam L, as described above. In some embodiments, the material of the metal layer 15 is Cu, Ni, Ag, or Au, particularly Cu. The layer thickness of the metal layer 15 is, for example, 1 µm or more and 100 µm or less.

With reference to FIG. 3 and FIG. 4, the film-deposition apparatus 50 will be firstly described and then, the formation of the metal layer 15 using the film-deposition apparatus 50 will be described. FIG. 3 is a cross-sectional view showing the structure of the film-deposition apparatus 50 that is used to manufacture the wiring board 1 according to the embodiment of the present disclosure. FIG. 4 is a cross-sectional view of the film-deposition apparatus 50 shown in FIG. 3 when a housing 53 is lowered to a predetermined height.

(1) Structure of Film-Deposition Apparatus 50

The film-deposition apparatus 50 is a film-deposition apparatus (i.e., a plating apparatus) for depositing the metal layer 15 as metallic coating by solid electrolyte deposition and is used to deposit (to form) the metal layer 15 on the surface of the seed layer 13.

As shown in FIG. 3, the film-deposition apparatus 50 includes a metal anode 51, a solid electrolyte membrane 52 disposed between the anode 51 and the seed layer 13 as a cathode, and a power supply 54 to apply voltage between the anode 51 and the underlayer 12. The underlayer 12, the seed layer 13, and the diffusion layer 14 formed therebetween are electrically connected with each other, and therefore, electric current flows between the anode 51 and the seed layer 13 during the film deposition by applying voltage between the anode 51 and the underlayer 12 from the power supply 54.

In the present embodiment, the film-deposition apparatus 50 further includes the housing 53. The housing 53 stores the anode 51 and a solution L (hereinafter referred to as a metallic solution L) containing ions of metal (for example, Cu) as the material of the metal layer 15. More specifically, a space for storing the metallic solution L is defined between the anode 51 and the solid electrolyte membrane 52, where the stored metallic solution L flows from one side to the other side.

When the anode 51 and the solid electrolyte membrane 52 are spaced apart from each other as shown in FIG. 3, the anode 51 has a plate-like shape and may be either a soluble anode made of the same material (e.g., Cu) as that of the metal layer 15 or an anode made of material (e.g., Ti) that is insoluble in the metallic solution L. Meanwhile, though not shown in the drawing, when the anode 51 and the solid electrolyte membrane 52 are in contact with each other, the anode 51 may be a porous anode through which the metallic solution L penetrates and that supplies metal ions to the solid electrolyte membrane 52.

It should be noted that pressing the anode 51 against the solid electrolyte membrane 52 could cause uneven deposition due to the uneven pressing force of the anode 51 exerted on the solid electrolyte membrane 52. Thus, for producing a fine wiring pattern, the anode 51 and the solid electrolyte membrane 52 are favorably configured so as to be spaced apart from each other, as shown in FIG. 3.

The solid electrolyte membrane 52 is not particularly limited, as long as the solid electrolyte membrane 52 can be impregnated with (contain) metal ions when brought into contact with the aforementioned metallic solution L and the metal originating from the metal ions can be deposited on the surface of the cathode (seed layer 13) when voltage is applied.

The thickness of the solid electrolyte membrane 52 is about 5 μm to about 200 μm, for example. Examples of the material of the solid electrolyte membrane 52 include resin having a cation exchange function, including fluorine-based resin, such as Nafion (registered trademark) manufactured by DuPont, hydrocarbon resin, polyamic acid resin, and Selemion (CMV, CMD, CMF series) manufactured by Asahi Glass Co.

The metallic solution L is liquid containing the metal of the metal layer 15 in an ionic state, and examples of the metal may include Cu, Ni, Ag, or Au. The metallic solution L is a solution (ionized) of these metals with an acid, such as nitric acid, phosphoric acid, succinic acid, sulfuric acid, or pyrophosphoric acid.

The film-deposition apparatus 50 of the present embodiment further includes an elevator 55 above the housing 53 to move the housing 53 up and down. The elevator 55 may include a hydraulic or pneumatic cylinder, an electric actuator, a linear guide, and a motor, as long as the elevator 55 can move the housing 53 up and down.

The housing 53 has a supply port 53a through which the metallic solution L is supplied and a discharge port 53b through which the metallic solution L is discharged. The supply port 53a and the discharge port 53b are connected to a tank 61 via a pipe. The metallic solution L delivered from the tank 61 by a pump 62 flows into the housing 53 through the supply port 53a and is discharged through the discharge port 53b to return to the tank 61. A pressure regulation valve 63 is provided downstream of the discharge port 53b. The pressure regulation valve 63 and the pump 62 can pressurize the metallic solution L in the housing 53 with a predetermined pressure.

With such a configuration, the liquid pressure of the metallic solution L causes the solid electrolyte membrane 52 to press at least the seed layer 13 during the film deposition (see FIG. 4), so that the metal layer 15 can be deposited on the seed layer 13 while uniformly pressing the seed layer 13 with the solid electrolyte membrane 52.

The film-deposition apparatus 50 of this embodiment includes a metallic mount 56 to mount the substrate with seed-layer 10 in which the diffusion layer 14 is formed. The metallic mount 56 is electrically connected (is conductive) to the negative electrode of the power supply 54. The positive electrode of the power supply 54 is electrically connected (is conductive) to the anode 51 that is built in the housing 53.

Specifically, the film-deposition apparatus 50 includes a conductive member 57 that contacts a part of the underlayer 12 or the seed layer 13 (specifically, an end thereof) during the film deposition of the metal layer 15 so as to electrically connect the negative electrode of the power supply 54 with the underlayer 12 or the seed layer 13. The conductive member 57 is a metal plate that covers a part of the edge of the substrate with seed-layer 10 in which the diffusion layer 14 is formed, and is partially bent so as to contact the metallic mount 56. This electrically connects the metallic mount 56 with the underlayer 12 via the conductive member 57. The conductive member 57 may be detachable from the substrate with seed-layer 10 in which the diffusion layer 14 is formed.

(2) Formation of Metal Layer 15 Using Film-Deposition Apparatus 50

The formation step S3 of the metal layer 15 places the substrate with seed-layer 10 in which the diffusion layer 14 is formed and the conductive member 57 at predetermined positions on the metallic mount 56 as shown in FIG. 3. Then, as shown in FIG. 4, the elevator 55 lowers the housing 53 to a predetermined height.

Next, when the metallic solution L is pressurized by the pump 62, the solid electrolyte membrane 52 follows the shapes of the seed layer 13 and the underlayer 12, and the pressure regulation valve 63 adjusts the pressure of the metallic solution L in the housing 53 to a set constant pressure. That is, the solid electrolyte membrane 52 is able to uniformly press the surface of the seed layer 13 and the surface of the exposed portion 12a of the underlayer 12 with the adjusted liquid pressure of the metallic solution L in the housing 53.

In such a pressed state, voltage is applied between the anode 51 and the underlayer 12 to reduce the metal ions contained in the solid electrolyte membrane 52, so that metal originating from the metal ions is deposited on the surface of the seed layer 13. Since the application of voltage continuously reduces, at the cathode, the metal ions of the metallic solution L in the housing 53, the metal layer 15 is formed on the surface of the seed layer 13 as shown in FIG. 2C.

Herein, when the underlayer 12 contains, on the surface of the exposed portion 12a, an oxide such as a natural oxide film or an oxide film formed by surface treatment, the surface of the exposed portion 12a has a higher insulating property. Therefore, when the solid electrolyte membrane 52 is in close contact with the surface of the seed layer 13 and the surface of the exposed portion 12a of the underlayer 12, the current flows only on the surface of the seed layer 13. This reduces the metal ions (for example, copper ions) contained in the solid electrolyte membrane 52 so as to deposit the metal (for example, copper) on the surface of the seed layer 13. As a result, the metal layer 15 is formed selectively on the surface of the seed layer 13 (see FIG. 2C), so that the metal can be prevented from being deposited on the surface of the exposed portion 12a of the underlayer 12.

When the metal layer 15 is formed so as to have a predetermined thickness, the application of voltage between the anode 51 and the underlayer 12 stops to thereby stop pressurization of the metallic solution L by the pump 62. Then, the housing 53 is raised to a predetermined height so that the solid electrolyte membrane 52 is peeled off from the seed layer 13 and the exposed portion 12a of the underlayer 12 (see FIG. 3).

Herein, in the present embodiment, the adhesion between the underlayer 12 and the seed layer 13 is improved with the diffusion layer 14 formed therebetween, which can thus prevent the underlayer 12 and the seed layer 13 from being peeled off from each other when the solid electrolyte membrane 52 is peeled off. After the housing 53 is raised, the substrate with seed-layer 10 (see FIG. 2C) on which the metal layer 15 is formed is removed from the metallic mount 56.

1-4. Removing Step S4

Next, a removing step S4 is performed as shown in FIG. 1. This step removes, from the substrate 11, the exposed portion 12a without the seed layer 13 of the underlayer 12 as shown in FIG. 2D, so that the wiring layer 2 is formed on the surface of the substrate 11.

The method for removing the underlayer 12 is not particularly limited, and various methods, such as plasma etching, sputtering, and chemical etching, may be used. When the underlayer 12 is made of $WSi_2$ or $ZrSi_2$, for example, the exposed portions 12a of the underlayer 12 are removed by plasma etching using $CF_4$ gas in some embodiments. Such removal forms the wiring layer 2 including the underlayer 12, the diffusion layer 14, the seed layer 13, and the metal layer 15 on the surface of the substrate 11 as shown in FIG. 2D.

2. Wiring Board 1

The wiring board 1 shown in FIG. 2D can be manufactured in the above-described manner. The manufactured wiring board 1 includes the insulating substrate 11, and the wiring layer 2 disposed on the surface of the substrate 11 and having a predetermined wiring pattern. The wiring layer 2 includes the underlayer 12 disposed on the surface of the substrate 11, the seed layer 13 disposed on the surface of the underlayer 12, and the metal layer 15 disposed on the surface of the seed layer 13. The underlayer 12 is electrically conductive, and the seed layer 13 contains metal.

In the present embodiment, the diffusion layer 14, in which the elements forming the underlayer 12 and the seed layer 13 are mutually diffused, is formed between the underlayer 12 and the seed layer 13. The seed layer 13 is thus bonded to the surface of the underlayer 12 via the diffusion layer 14. The wiring board 1 of the present embodiment can improve the adhesion between the underlayer 12 and the seed layer 13 with the diffusion layer 14, and as a result, the reliability of the wiring board 1 can be improved.

EXAMPLES

The present disclosure will be described below using reference examples.
1. Evaluation of Examples With and Without Laser Beam Irradiation
<Reference Example 1>

A seed layer made of Ag was formed on the surface of the underlayer made of $WSi_2$. The seed layer was formed by sputtering using Ag as a target. Then, a test piece of Reference Example 1 was prepared by irradiating the formed seed layer with a laser beam in an Ar atmosphere under the conditions in which the laser wavelength was 1,064 nm, the laser output density was 40 $W/mm^2$, the irradiation time was one second, and the spot diameter was 10 mm.
<Reference Comparative Example 1>

A test piece of Reference Comparative Example 1 was prepared in the same manner as in the preparation of Reference Example 1, except that the seed layer was not irradiated with the laser beam.
[Observation of Cross-Section]

The cross-section of each test piece of Reference Example 1 and Reference Comparative Example 1 was observed using a transmission electron microscope (TEM), and an X-ray element analysis was conducted to analyze the elements at the boundary between the underlayer and the seed layer. The results are shown in FIG. 5

A tape peeling test that will be described later was conducted to evaluate the adhesion between the underlayer and the seed layer of each test piece of Reference Example 1 and Reference Comparative Example 1.
[Tape Peeling Test]

The tape peeling test was conducted such that CELLO-TAPE™ CT-18 manufactured by Nichiban Co., Ltd. was applied onto the surface of the seed layer of each test piece, and the applied tape was peeled off from the test piece in the perpendicular direction, so that the presence of peeling on the surface of the seed layer was evaluated.
[Results and Evaluation 1]

The tape peeling test revealed that when a laser beam was not irradiated as in Reference Comparative Example 1, the seed layer was peeled off, while when a laser beam was irradiated as in Reference Example 1, the seed layer was not peeled off. This proves that the irradiation of the seed layer with a laser beam can improve the adhesion between the underlayer and the seed layer.

Further, as can be perceived from the TEM images of FIG. 5, in Reference Comparative Example 1, diffusion of the elements (W and Si) forming the underlayer and the element (Ag) forming the seed layer was not confirmed. Meanwhile, in Reference Example 1, a diffusion layer, in which the elements (W and Si) forming the underlayer and the element (Ag) forming the seed layer were diffused, is confirmed to have been formed between the underlayer made of $WSi_2$ and the seed layer made of Ag.

These results prove that the underlayer and the seed layer bond together due to the diffusion of the elements on the contacting surface between the underlayer (solid phase) and the seed layer (solid phase) through the irradiation of the laser beam, but not by melting of the underlayer and the seed layer.

The diffusion layer in which the elements are diffused as such has a relatively large amount of elements forming the seed layer on its seed layer side, and a relatively large amount of elements forming the underlayer on its underlayer side. Therefore, the adhesion between the seed layer and the underlayer is considered to be improved via the diffusion layer.

Thus, it is considered that the irradiation of the seed layer with a laser beam forms, between the underlayer and the seed layer, the diffusion layer in which the elements forming the underlayer and the seed layer are mutually diffused, and this diffusion layer can improve the adhesion between the underlayer and the seed layer.

In addition, as can be perceived from the TEM images of the FIG. 5, Reference Comparative Example 1 is confirmed to have formed an oxide (SiO) at the interface between the underlayer and the seed layer. This oxide is considered to be a natural oxide film that was naturally formed on the surface of the underlayer due to natural oxidization in the atmosphere prior to forming the seed layer on the surface of the underlayer when the test piece was prepared. Specifically, it is considered that in Reference Comparative Example 1, the oxide was formed on the contacting surface (contacting surface of the underlayer) where the underlayer contacts the seed layer because the seed layer was formed on the underlayer with the natural oxide film formed thereon. The seed layer made of metal does not easily adhere to the oxide, and therefore, the adhesion between the underlayer and the seed layer is likely to lower.

Meanwhile, as can be perceived from the TEM images of FIG. 5, in Reference Example 1, formation of an oxide (SiO) was not confirmed. The diffusion layer confirmed to have been formed contained the oxygen element as well as the elements forming the underlayer and the seed layer.

In Reference Example 1, the irradiation of the seed layer with a laser beam allowed Ag forming the seed layer to be diffused in the oxide formed on the contacting surface of the underlayer, so that the oxygen atoms forming the oxide are believed to have also been diffused in the seed layer. Such formation of the diffusion layer can improve the adhesion between the underlayer and the seed layer.

2. Evaluation of Adhesion Between Seed Layer and Underlayer

A test piece having an Ag sputter film formed as the seed layer on the surface of the underlayer made of $WSi_2$ was prepared, so that the adhesion between the underlayer and the seed layer was evaluated. The details will be described below.

<Reference Example 2-1>

A test piece of Reference Example 2-1 was prepared in the same manner as in the preparation of Reference Example 1, except that Reference Example 2-1 was prepared under the conditions of the laser beam irradiation in which the laser wavelength was 1,064 nm (near infrared region), the laser output density was 43 $W/mm^2$, and the irradiation time was one second, which were different from those of Reference Example 1. The prepared test piece was visually observed to see if there was any partial melting or agglomeration of Ag forming the seed layer, on the surface of the seed layer. Further, the aforementioned tape peeling test was conducted.

<Reference Example 2-2 to Reference Example 2-4>

Test pieces of Reference Example 2-2 to Reference Example 2-4 were prepared in the same manner as in the preparation of Reference Example 2-1, except for the laser output density, and the presence of melting or agglomeration of Ag was observed and the tape peeling test was conducted. The laser output density was set to 40 $W/mm^2$, 38 $W/mm^2$, and 35 $W/mm^2$ for Reference Examples 2-2, 2-3, and 2-4, respectively.

<Reference Example 2-5>

A test piece of Reference Example 2-5 was prepared in the same manner as in the preparation of Reference Example 2-1, except for the laser output density and irradiation time, and the presence of melting or agglomeration of Ag was observed and the tape peeling test was conducted. The laser output density and irradiation time for Reference Example 2-5 were set to 5 $W/mm^2$ and 15 seconds, respectively.

<Reference Example 2-6 to Reference Example 2-9>

Test pieces of Reference Example 2-6 to Reference Example 2-9 were prepared in the same manner as in the preparation of Reference Example 2-5, except for the irradiation time, and the presence of melting or agglomeration of Ag was observed and the tape peeling test was conducted. The irradiation time was set to 30 seconds, 50 seconds, 60 seconds, and 120 seconds for Reference Examples 2-6, 2-7, 2-8, and 2-9, respectively.

<Reference Example 2-10 to Reference Example 2-13>

Test pieces of Reference Examples 2-10 to 2-13 were prepared in the same manner as in the preparation of Reference Example 2-1, except for the laser output density, and the presence of melting or agglomeration of Ag was observed and the tape peeling test was conducted. The laser output density was set to 48 $W/mm^2$, 45 $W/mm^2$, 33 $W/mm^2$, and 30 $W/mm^2$ for Reference Examples 2-10, 2-11, 2-12, and 2-13, respectively.

<Reference Comparative Example 2-1>

A test piece of Reference Comparative Example 2-5 was prepared in the same manner as in the preparation of Reference Example 2-1, except that a laser beam was not irradiated, and the presence of melting or agglomeration of Ag was observed and the tape peeling test was conducted.

Table 1 shows the results of observation of the presence of melting or agglomeration of Ag and the tape peeling test of Reference Example 2-1 to Reference Example 2-13 and Reference Comparative Example 2-1 as well as the laser output density and irradiation time that were set for the examples.

TABLE 1

| | Underlayer | Formation method of seed layer | Laser output density ($W/mm^2$) | Irradiation time (second) | Melting/ agglomeration on surface of seed layer | Tape peeling test |
|---|---|---|---|---|---|---|
| Reference Example 2-1 | $WSi_2$ | Sputtering | 43 | 1 | None | Excellent |
| Reference Example 2-2 | $WSi_2$ | Sputtering | 40 | 1 | None | Excellent |

TABLE 1-continued

| | Under-layer | Formation method of seed layer | Laser output density (W/mm$^2$) | Irradiation time (second) | Melting/ agglomeration on surface of seed layer | Tape peeling test |
|---|---|---|---|---|---|---|
| Reference Example 2-3 | WSi$_2$ | Sputtering | 38 | 1 | None | Excellent |
| Reference Example 2-4 | WSi$_2$ | Sputtering | 35 | 1 | None | Excellent |
| Reference Example 2-5 | WSi$_2$ | Sputtering | 5 | 15 | None | Excellent |
| Reference Example 2-6 | WSi$_2$ | Sputtering | 5 | 30 | None | Excellent |
| Reference Example 2-7 | WSi$_2$ | Sputtering | 5 | 50 | None | Excellent |
| Reference Example 2-8 | WSi$_2$ | Sputtering | 5 | 60 | None | Excellent |
| Reference Example 2-9 | WSi$_2$ | Sputtering | 5 | 120 | None | Excellent |
| Reference Example 2-10 | WSi$_2$ | Sputtering | 48 | 1 | Present | Excellent |
| Reference Example 2-11 | WSi$_2$ | Sputtering | 45 | 1 | Present | Excellent |
| Reference Example 2-12 | WSi$_2$ | Sputtering | 33 | 1 | None | Fairly good |
| Reference Example 2-13 | WSi$_2$ | Sputtering | 30 | 1 | None | Fairly good |
| Reference Comparative Example 2-1 | WSi$_2$ | Sputtering | None | None | None | Defective |

[Results and Evaluation 2]

As can be confirmed from the results of the tape peeling test, Reference Example 2-1 to Reference Example 2-13 improved the adhesion due to the laser beam irradiation, as compared to Reference Comparative Example 2-1, which was not irradiated with a laser beam. The results of the tape peeling test conducted on Reference Example 2-12 and Reference Example 2-13 were determined to be "fairly good," since they have shown slight peeling as compared to the other reference examples; however, since they have formed the diffusion layer, the adhesion of the seed layer is considered to be higher as compared to that of Reference Comparative Example 2-1. The melting or agglomeration was confirmed to be present in the seed layer in Reference Example 2-10 and Reference Example 2-11; however, since the seed layer has maintained its shape on the surface of the underlayer, these reference examples were determined to be available for use as a wiring board.

3. Evaluation of Ink in which Ag Nanoparticles are Dispersed in Dispersion Medium A test piece having a seed layer formed of ink was prepared, so that the adhesion between the underlayer and the seed layer was evaluated.

<Reference Example 3-1>

Ink was applied onto the surface of the underlayer made of WSi$_2$ by screen printing, and the applied ink was dried under the conditions in which the drying temperature was 120° C. and the drying time was 30 minutes, so that a seed layer was formed.

The amount of the dispersion medium of the ink remaining in the seed layer (hereinafter, the remaining amount of the dispersion medium) after drying was 0.1 mass % or less relative to the formed seed layer. In other words, the amount of Ag forming the formed seed layer was 99.9 mass % or more relative to the formed seed layer.

It should be noted that the remaining amount of the dispersion medium corresponds to the amount of the dispersion medium of the ink remaining in the seed layer relative to the seed layer (the total amount of Ag nanoparticles forming the seed layer and the dispersion medium of the ink remaining in the seed layer). The remaining amount of the dispersion medium was measured using the GC-MS (gas chromatography).

Next, a test piece of Reference Example 3-1 was prepared by irradiating the formed seed layer with a laser beam in an Ar atmosphere under the conditions in which the laser wavelength was 940 nm (near infrared region), the laser output density was 75 W/mm$^2$, and the irradiation time was one second, and the presence of melting or agglomeration of Ag was observed and the tape peeling test was conducted, in such a manner as described above.

<Reference Example 3-2>

A test piece of Reference Example 3-2 was prepared in the same manner as in the preparation of Reference Example 3-1, and the presence of melting or agglomeration of Ag was observed and the tape peeling test was conducted. Reference Example 3-2 was different from Reference Example 3-1 in that Reference Example 3-2 used the underlayer made of ZrSi$_2$.

<Reference Examples 3-3 and 3-4>

Test pieces of Reference Examples 3-3 and 3-4 were prepared in the same manner as in the preparation of Reference Example 3-1, and the presence of melting or agglomeration of Ag was observed and the tape peeling test was conducted. The drying temperatures of ink for Reference Examples 3-3 and 3-4 were different from that for Reference Example 3-1. Specifically, the drying temperature was set to 80° C. and 100° C. for Reference Comparative Examples 3-1 and 3-2, respectively. Table 2 shows the results of observation of the presence of melting or agglomeration of Ag and the tape peeling test of Reference Example 3-1 to Reference Example 3-4 as well as the conditions of the underlayer and the seed layer for the reference examples.

<Reference Comparative Example 3-1 to Reference Comparative Example 3-6>

Further, to evaluate the adhesion when heat treatment is conducted in the atmosphere instead of performing laser beam irradiation, Reference Comparative Examples 3-1 to 3-6 described below were prepared and tested.

Test pieces of Reference Comparative Example 3-1 to Reference Comparative Example 3-6 were prepared in the same manner as in the preparation of Reference Example 3-1, and the presence of melting or agglomeration of Ag was observed and the tape peeling test was conducted. Reference Comparative Example 3-1 to Reference Comparative Example 3-6 were different from Reference Example 3-1 in that in the reference comparative examples, heat treatment was conducted in the atmosphere instead of laser beam irradiation, and further, Reference Comparative Example 3-4 to Reference Comparative Example 3-6 used the underlayer made of $ZrSi_2$. Table 3 shows the results of observation of the presence of melting or agglomeration of Ag and the tape peeling test of Reference Example 3-1 to Reference Example 3-6 as well as the conditions of the underlayer and the seed layer for the reference examples.

[Results and Evaluation 3]

Reference Examples 3-1 and 3-2 improved the adhesion as compared to Reference Examples 3-3 and 3-4. In Reference Examples 3-3 and 3-4, which were dried at a lower temperature, insufficient dryness in forming the seed layer has left a large amount of dispersion medium of the ink in the formed seed layer. Therefore, it is considered that the laser beam irradiation caused the remaining dispersion medium to evaporate to thereby expand in volume, so that the Ag nanoparticles partially scattered, resulting in uneven formation of the diffusion layer and slightly lowering the adhesion between the underlayer and the seed layer.

Meanwhile, in Reference Examples 3-1 and 3-2, drying was conducted until the remaining amount of the dispersion medium of the ink in the formed seed layer was reduced to 0.1 mass % or less, and as a result, the adhesion is considered to have improved. Thus, the improvement in the adhesion between the underlayer and the seed layer can be expected by reducing the amount of the dispersion medium of the ink remaining in the seed layer to 0.1 mass % or less.

Further, as compared to Reference Example 3-1, the adhesion between the underlayer and the seed layer of Reference Comparative Examples 3-1 to 3-6 was extremely low. Noble metal elements such as Ag have a low affinity with oxygen of an oxide. Thus, it is considered that when an oxide is generated on the contacting surface of the under-

TABLE 2

|  | Underlayer | Drying temperature of seed layer (° C.) | Laser output density (W/mm$^2$) | Irradiation time (second) | Melting/ agglomeration on surface of seed layer | Tape peeling test |
|---|---|---|---|---|---|---|
| Reference Example 3-1 | $WSi_2$ | 120 | 75 | 1 | None | Excellent |
| Reference Example 3-2 | $ZrSi_2$ | 120 | 75 | 1 | None | Excellent |
| Reference Example 3-3 | $WSi_2$ | 80 | 75 | 1 | None | Fairly good |
| Reference Example 3-4 | $WSi_2$ | 100 | 75 | 1 | None | Fairly good |

TABLE 3

|  | Underlayer | Drying temperature of seed layer (° C.) | Heat treatment temperature (° C.) | Heat treatment time (minute) | Melting/ agglomeration on surface of seed layer | Tape peeling test |
|---|---|---|---|---|---|---|
| Reference Comparative Example 3-1 | $WSi_2$ | 120 | 120 | 30 | None | Defective |
| Reference Comparative Example 3-2 | $WSi_2$ | 120 | 160 | 30 | None | Defective |
| Reference Comparative Example 3-3 | $WSi_2$ | 120 | 200 | 30 | None | Defective |
| Reference Comparative Example 3-4 | $ZrSi_2$ | 120 | 120 | 30 | None | Defective |
| Reference Comparative Example 3-5 | $ZrSi_2$ | 120 | 160 | 30 | None | Defective |
| Reference Comparative Example 3-6 | $ZrSi_2$ | 120 | 200 | 30 | None | Defective | layer, Ag in the seed layer cannot be diffused in the oxide by performing general heat treatment, and as a result, the adhesion between the underlayer and the seed layer of Reference Comparative Examples 3-1 to 3-6 was extremely low.

Meanwhile, it is considered that in Reference Example 3-1 to Reference Example 3-4, the laser beam irradiation instantly raised the temperature to a high temperature, so that Ag was able to diffuse into the oxide. As a result, the diffusion layer in which O as well as Ag, W, and Si was diffused was formed, so that the adhesion is considered to have been improved. Accordingly, when the element forming the seed layer is a noble metal element, and an oxide is generated on the contacting surface of the underlayer, the seed layer may be irradiated with a laser beam.

Although the embodiment of the present disclosure has been described in detail above, the present disclosure is not limited to the above embodiment, and various design changes can be made without departing from the spirit of the present disclosure described in the claims.

What is claimed is:

1. A method for manufacturing a wiring board including an insulating substrate, and a wiring layer disposed on a surface of the insulating substrate and having a predetermined wiring pattern, the method comprising:
    preparing a substrate with seed-layer including an electrically conductive underlayer on the surface of the insulating substrate and a seed layer on a surface of the underlayer, the seed layer having a predetermined pattern corresponding to the wiring pattern and containing metal;
    forming a diffusion layer in which an element forming the underlayer and an element forming the seed layer are mutually diffused, between the underlayer and the seed layer, by irradiating the seed layer with a laser beam;
    forming a metal layer on a surface of the seed layer by disposing a solid electrolyte membrane between an anode and the seed layer as a cathode, pressing the solid electrolyte membrane against at least the seed layer, and applying voltage between the anode and the underlayer to reduce metal ions contained in the solid electrolyte membrane;
    forming the wiring layer by removing, from the insulating substrate, an exposed portion of the underlayer that is not located under the seed layer; and
wherein
    the seed layer contains metallic nanoparticles,
    in preparing the substrate with seed-layer, ink in which the metallic nanoparticles are dispersed in a dispersion medium is applied onto the underlayer in the predetermined pattern and the applied ink is then dried so as to form the seed layer, and
    the ink is dried until an amount of the dispersion medium remaining in the seed layer is reduced to 0.1 mass % or less relative to the seed layer.

2. The method for manufacturing the wiring board according to claim 1, wherein
    the element forming the seed layer is a noble metal element,
    the underlayer of the prepared substrate with seed-layer contains an oxide on a contacting surface where the underlayer contacts the seed layer, and
    in forming the diffusion layer, a diffusion layer in which oxygen originating from the oxide is diffused is formed as the diffusion layer by irradiating the seed layer with the laser beam.

* * * * *